United States Patent [19]
Williams et al.

[11] 3,973,195
[45] Aug. 3, 1976

[54] CURRENT POTENTIAL INDICATOR
[75] Inventors: Robert A. Williams; David M. Holt, both of Forth Worth, Tex.
[73] Assignee: Williams Instrument, Inc., Fort Worth, Tex.
[22] Filed: May 13, 1974
[21] Appl. No.: 469,055

Related U.S. Application Data
[62] Division of Ser. No. 85,693, Oct. 30, 1970, Pat. No. 3,820,023.

[52] U.S. Cl. ............................... 324/72.5; 324/133; 324/157
[51] Int. Cl.² ................ G01R 31/02; G01R 19/14
[58] Field of Search ............... 324/72.5, 133, 122, 324/115, 102, 157

[56] References Cited
UNITED STATES PATENTS
1,649,180  11/1927  Peters ............................. 324/102

OTHER PUBLICATIONS
Triplett Test Equipment Catalog; p. 3; 1968.

*Primary Examiner*—R. V. Rolinec
*Assistant Examiner*—Ernest F. Karlsen
*Attorney, Agent, or Firm*—Wofford, Felsman, Fails & Zobal

[57] ABSTRACT

A current potential indicator for connection with electrical contacts for detecting with a minimum event indicator the presence of a minimum electrical energy potential available at the contacts, and a threshold indicator for sensing a selected quantity of electrical energy above said minimum energy level. The apparatus is specially adapted for insertion into a pyrotechnic cartridge well or breech cap of a weapons system using pyrotechnically discharged weapons by utilizing a housing with retainer means for releasable connection with the well or breech cap. No electrical power supply is required for operation of this current potential indicator, thus producing essentially fail sale reliability.

8 Claims, 3 Drawing Figures

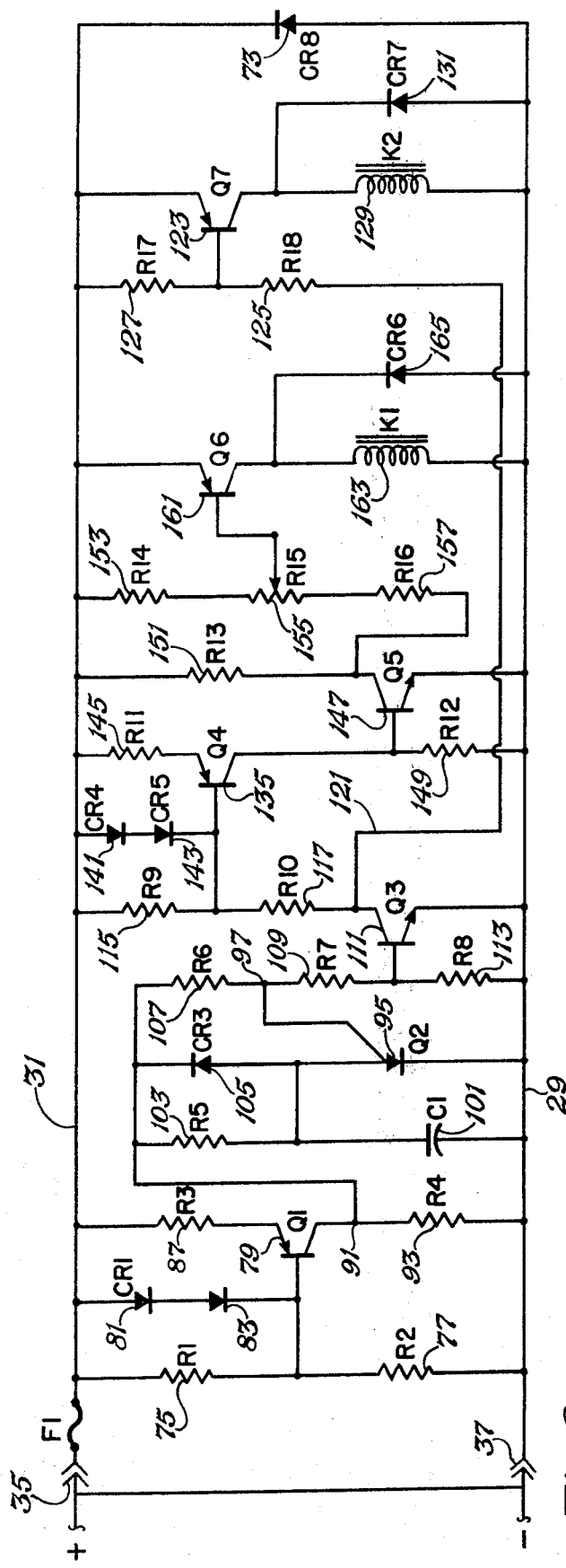

CURRENT POTENTIAL INDICATOR

This is a division of application Ser. No. 85,693, filed Oct. 30, 1970, U.S. Pat. No. 3,820,023.

BACKGROUND OF THE INVENTION

1. Field of the Invention

This invention relates in general to electrical test apparatus, and in particular to apparatus for testing the energy level across the electrical contacts in an electrical detonator circuit used to fire a pyrotechnic cartridge in a weapons system such as those used on military aircraft.

2. Description of the Prior Art

Previously, apparatus and systems have been developed for testing detonator circuits in weapons systems to detect spurious electrical energy when the detonator circuit is intentionally energized, or a selected threshold quantity of electrical energy when the system is de-energized.

As explained in U.S. Pat. No. 3,505,635, pyrotechnic cartridges are now extensively utilized in aircraft for ejecting bombs or other weapons. These cartridges are releasably connected with electrical circuitry, which when energized, detonates the cartridge, thus emitting a high-pressure gas which may, for example, release a latching device and immediately thereafter eject a bomb. Such devices have proven dangerous during the arming of aircraft previous to missions. Premature ejection of a bomb occurs upon inserting one of the cartridges into a well in which the detonator circuit has been accidentally or inadvertently energized. Accordingly, it is essential that the detonator circuit of such devices be tested prior to arming the weapons system for the presence or level of electrical energy.

A satisfactory test probe for insertion into a pyrotechnic cartridge well or breech cap is disclosed in U.S. Pat. No. 3,505,635. In such devices, the test indicators which detect the quantity of electrical energy across the electrical contacts in a pyrotechnic cartridge well or breech cap are located on the exterior of the test probe, usually in a console electrically connected with the test probe. Commonly, such console contains electrical circuits and power sources, which themselves are capable of malfunction, with the result that it is sometimes difficult to know with certainty whether the pyrotechnic detonator circuit or the test circuit is defective.

It is accordingly, the general object of this invention to provide a small, protable and rugged test instrument requiring no batteries or supplemental power supply for testing various aircraft weapons release firing signals with essentially fail-safe reliability.

Another object of the invention is to provide a current potential indicator, especially suitable for weapons systems testing, that utilize a test probe, an electrical minimum event indicator to detect a minimum amount of electrical energy, and an electrical threshold indicator for sensing a selected quantity of electrical energy above said minimum.

Another object of the invention is to provide in a weapons test system a current potential indicator including a minimum event indicator and a threshold indicator combined with a constant current source for greater accuracy in sensing selected quantities of electrical energy, such apparatus being self-contained, without need for attachment to a separate test console.

Another object of the invention is to provide a current potential indicator for use in weapons systems including a minimum event indicator and a threshold indicator, as well as resistance means that is variable to enable selection of the quantity of energy that activates the threshold indicator.

Another object of the invention is to provide a current potential indicator, especially suitable for weapons systems testing, including load disconnect means for disconnecting the circuit after a selected interval of electrical energy application.

SUMMARY OF THE INVENTION

Broadly, the invention consists of a test probe having a pair of electrical contacts adapted to engage mating contacts in a weapons systems cartridge well or breech cap, a minimum event indicator to sense a selected minimum quantity of electrical energy, a threshold indicator to sense a selected quantity of electrical energy above said minimum, and a circuit means connecting the contacts with the minimum event and threshold indicators for actuation thereof.

Describing briefly circuit means for accomplishing the above a transistor Q1 (see Fig. 2) acts as a constant current source for a programmable unijunction transistor (PUT) Q2, transistor Q3, and an RC network comprising R5 and C1. If the voltage input to the probe increases, the potential across resistor R4 also increases until it is sufficient to turn the transistor Q3 on. When Q3 turns on, its collector pulls to ground, turning transistors Q4 and Q7 on. When Q7 turns on it supplies current to indicator K2, which is a "minimum event" indicator. When Q4 turns on, it supplies base current to the power transistor Q5, turning it on. Transistor Q5 must only be capable of carrying approximately four amperes, since transistor Q4 is connected to current limit at approximately 150 milliamperes of base current for transistor Q5, which will limit the maximum collector current drawn through Q5.

The threshold circuit comprises a transistor Q6, resistors R14, R15, R16 and an indicator K1. This circuit is connected directly across a load resistor R13 to detect the threshold currents through the load, and may be adjusted from approximately 2 to 4 amperes as a selected threshold range. Whenever the voltage across R13 is sufficient, transistor Q6 turns on, supplying current to indicator K1 to cause it to switch.

Since the firing pulse may be applied to the circuit for any length of time, depending upon how long the operator depresses the weapon system fire button, provision has been made to disconnect the load from the firing circuit after approximately 15 milliseconds. When the minimum current transistor Q1 turns on, the voltage across resistor R4 is applied to transistor Q2 and the R5 and C1 network. Capacitor C1 is normally discharged, but when the transistor Q1 turns on the capacitor C1 begins to charge through resistor R5. When the potential on the PUT Q2 annode is slightly greater then the potential of the gate, Q2 will turn on, causing its gate to pull to ground. This turns off transistor Q3, which turns off Q4, Q5, Q6, and Q7, disconnecting the load resistor and indicators K1 and K2. The circuit will remain in this disconnected state until the input voltage decreases to below the transistor Q1 threshold. Thus, nothing in the circuit turns on until the minimum detect transistor Q1 turns on.

Diodes CR1 and CR2 are used with Q1 and R3, as are diodes CR4 and CR5 with transistor Q4 and resistor R11 to provide current limiting through both these transistors Q1 and Q4. Diode CR3 provides a lower impedence discharge path for capacitor C1 and diodes CR6 and CR7 are used to shunt back-emf when the K1 and K2 field collapse, these particular indicators being magnetically operated in the preferred embodiment, although the invention is not limited in its broadest since to the use of any particular indicator type.

Since most of the circuitry draws current simultaneously with the load resistor, the load resistor is adjusted such that the parallel combination of the load resistor and other circuits approximates 1.5 ohms in the preferred embodiment. The collector-emitter voltage drop across the transistor Q5 compensates for the other circuitry, thus the load resistor R13 has a valve of approximately 1.5 ohms. When the current through the circuit is 3 amperes, the voltage measured across the circuit is approximately 4.5 volts, indicating that the equivalent load is approximately 1.5 ohms in the preferred embodiment to be explained in detailed subsequently.

BRIEF DESCRIPTION OF THE DRAWING

FIG. 1 is a fragmentary, perspective view showing test probe apparatus embodying the principles of the invention.

FIG. 2 is a circuit diagram of the circuit means including a minimum event indicator to sense a selected minimum quantity of electrical energy, and a threshold indicator for sensing a selected quantity of electrical energy above said minimum.

DESCRIPTION OF THE PREFERRED EMBODIMENT

Figure 3:
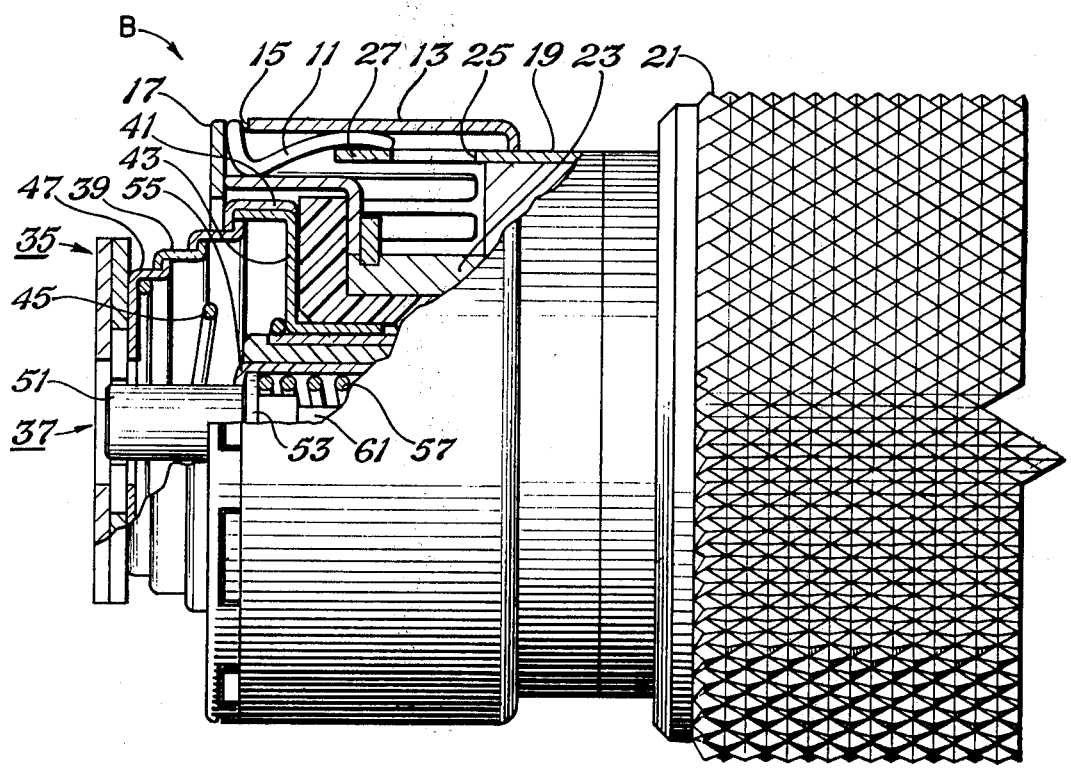
FIG. 3 is a fragmentary, side elevation view, in longitudinal section showing the electrical contacts and retainer means that form a portion of the test probe apparatus shown in Fig. 1.

The letter A in FIG. 1 designates the housing of a test probe, having on one end retainer means B for securing the housing to a relief grove, thread grooves or other indentations in a cartridge well or breech cap of a weapons system. Indicator means C appears on the opposite end of the housing and includes, as will be subsequently explained, a minimum event indicator and a threshold indicator, as well as circuit means D connected with electrical contacts (not shown in FIG. 1) generally circumscribed by the retainer means B.

With reference to FIG. 3, the retainer means B consists of a plurality of latch elements 11, portions thereof adapted to extend outward beyond the periphery of an annular shell 13 through apertures 15 adjacent a forward a forward wall 17. A ring portion 19 is carried by a movable shell 21 mounted on a body 23 for reciprocal movement thereon, the ring portion having a plurality of circumferentially spaced apertures 25 adjacent and behind forward lips 27. When the lips 27 are urged forward, they engage the extreme end of each associated latch element to force it outward through the aperture 15, the opposite end of the latch element falling partially within the aperture 25 of the ring portion 19. Upon retraction of the movable shell 21 and ring 19, the lips 27 of the ring move rearward to the position shown in FIG. 3 such that the latch elements 11, due to their arcuate configuration shown, are retracted from the aperture 15. Hence, the latch elements may be made to engage or disengage thread grooves, relief grooves, or indentations formed inside a cartridge well or breech cap, as is explained in greater detail in a co-pending application entitled *Latch Type Pyrotechnic Detonator Circuit Test Probe*, Ser. No. 777,674, filed Nov. 21, 1968.

Two electrical conductors 29, 31 connect respectively with inner contact means 31 and outer contact means 32 that lead to a resiliently mounted inner electrical contact 37 and a resiliently mounted outer contact 35. The outer contact 35 consists of an exterior plate engaged by a plurality of telescopic bellows 39, the larger and outer of which 41 is secured to an annular plate 43. A conical spring 45 connects between the smaller of said bellows 47 and the axially extending sleeve that forms apart of contact means 32. The outer contact 35, bellows 39, concical spring 45, plate 43 and sleeve 49 are all electrically conducted such that electricity flows therethrough from the contact 35 to the conductor 31.

The inner contact means 33 includes an axially extending sleeve 33 and reciprocably mounted button 51 having an interior flange 53 retained by the lip 55 on the sleeve, with a compression spring 57 being mounted between the flange 53 and an opposing shoulder 59 on a mandrel 61. Thus, both the inner and outer contact means have linear movement for positive engagement with the contacts inside the cartridge well or breech cap of the weapons release apparatus.

As also shown in FIG. 1, an interior section 63 of the test probe housing consists of a sleeve and preferably utilizes an O ring 65 for engagement with a cap 67 that houses a minimum event indicator K2 and a threshold indicator K1. Thus, the contact end and indicator ends of the housing are retained to the sleeve 63 preferably by threaded connections as shown in FIG. 1.

The circuit means B located within the sleeve 63 of the test probe is illustrated schematically in FIG. 2, where the outer and inner contacts are represented by the numerals 35 and 37 for connection respectively with the conductors 31 and 29, the contacts being referred to sometimes as input terminals in the following circuit description.

A preferably five amp fuse (F1) 71 is connected in the conductor 31 for current protection against excessively high current. The diode (CR8) 73 prevents. reversing polarity from damaging the circuit, although in practice this should not occur since the cartridge well or breech cap apparatus in the weapons system provides the correct and positive polarization. Biasing resistors (R1) 75 and (R2) 77 are serially connected with conductor 31 and the common or ground 29.

A transistor (Q1) 79 has its base connected with the juncture of resistors (R1) 75 and (R2) 77. The two diodes (CR1) 81 and (CR2) 83 are also connected with the base of the transistor (Q1) 79, while the resistor (R3) 87 is connected with the emitter of transistor (Q1) 79 to provide a constant current capability by limiting the current flow through the transistor (Q1) 79. Expressed otherwise, the transistor (Q1) 79 in combination with the resistor (R3) 87 and the two diodes (CR1) 81 and (CR2) 83 provide a constant current means or section to give a constant voltage output at the juncture 91 of the collector of the transistor (Q1) 79 and resistor (R4) 93. This allows a predictable time build-up for the programmable unijunction transistor (PUT) 95 (Q2) with its emitter and collector connected in the circuit at terminals 97, 99 such that the voltage at terminal 97 is preferably 0.6 volts higher than at terminal 99 for the purpose of turning on transistor (Q2) 95.

A capacitor (C1) 101 and resistance (R5) 103 of a RC network are connected with the juncture 91 between the collector of the transistor (Q1) 79 and resistance (R4) 93 such that the capacitor (C1) 101 starts charging through the resistor (R5) 103. The transistor (Q2) 95 is connected through terminal 99 with the juncture of resistor (R5) 103 and the capacitor (C1) 101 and with the ground or conductor 29. A diode (CR3) 105 is connected with terminal 99 and the juncture 91 to provide a discharge path so capacitor (C1) 101 can discharge rapidly when the transistor (Q1) 79 turns off. PUT transistor (Q2) 95 is also connected with terminal 97 at the juncture of the biasing transistors (R6) 107 and (R7) 109, terminal 97 also being connected with transistor (Q2) 95 as shown.

The base of a transistor (Q3) 111 is connected at the juncture of the resistor (R7) 109 and a resistor (R8) 113 in series therewith that is also connected with the ground or conductor 29. Accordingly, when the transistor (Q3) 95 turns on, the transistor (Q3) 111 is rendered conductive. The collector of transistor (Q3) 111 biasing resistors (R9) 115 and (R10) 117, are serially connected with the conductor 31 and conductor 29. The resistor (R9) 115 insures that the transistor (Q4) 119 is turned off when transistor (Q3) 111 turns off.

The collector of transistor (Q3) 111 is connected through conductor 121 with the base of a transistor (Q7) 123 by way of a biasing resistor (R18) 125. Another resistor (R17) 127 is serially connected with the base of transistor (Q7) 123 and with the conductor 31. The resistors (R17) 127 and (R18) 125 are biasing resistors to protect the transistor (Q7) 123 by limiting the base current flowing through it. When the transistor (Q3) 111 is rendered conductive, the conductor 121 and hence the base of the transistor (Q7) 123 is brought to ground to turn on its transistor and trip minimum event indicator (K2) 129. The diode (CR7) 131 connected across the indicator (K2) 129 and between the collector of the transistor (Q7) 123 and the conductor 29 provide polarity protection. When the transistor (Q3) 111 is rendered conductive, the transistor (Q4) 135 is rendered conductive, since its base is connected with the juncture of resistors (R9) 137 and (R10) 139 that are serially connected with conductor 31 and the juncture of the collector of the transistor (Q3) 111 and conductor 121. Similarly, as with the transistor (Q1) 79, the transistor (Q4) 135 also has diodes (CR4) 141 and (CR5) 143 connected with its base and with conductor 31. A resistor (R11) 145 is connected with the emitter of the transistor (Q4) 135 to provide constant current safety to limit the current available to the base of a transistor (Q5) 147. When the transistor (Q4) 135 is rendered conductive, transistor (Q5) 147 is rendered conductive, since the base of transistor (Q5) 147 is connected with the juncture of the collector of transistor (Q4) 135 and biasing resistor (R12) 14 that is connected with the base of transistor (Q5) 147 and the ground or conductor 29 to insure that the transistor (Q5) is turned off when the transistor (Q4) 135 is turned off.

The transistor (Q5) 147 impresses the basic load (R13) 151 of 1.5 ohms into the circuit. The transistor (Q5) 147 compensates for the effect of other elements in the circuit which tend to make the basic load vary from 1.5 ohms. Expressed otherwise, the basic load (R13) 151 and the transistor (Q5) 147 are serially connected with the conductor 31 and the ground 29. The biasing resistor (R14) 153, the potentiometer (R15) 155, one form of variable resistance means, and the biasing resistor (R16) 157 are serially connected with conductor 31 and the juncture of the collector of transistor (Q5) 147 and the resistor (R13) 151. The output terminal 159 of the potentiometer (R15) 155 is connected with the base of a transistor (Q6) 161 that has its emitter connected with conductor 31 and its connector connected with the indicator (K1) 163, which has a diode (CR6) 165 connected thereacross as shown to provide polarity protection.

The potentiometer (R15) 155 is set by adjusting the circuit pulses 10 milliseconds wide and applying a current of 3 amps and a voltage of 4.5 volts across the 1.5 ohm resistance (R13) 151, thereafter adjusting the potentiometer until the indicator (K1) 163 will initially actuate.

When the transistor (Q5) 147 is rendered conductive, the transistor (Q6) 161 is also rendered conductive to begin to actuate the indicator (K1) 163.

When the transistor (Q5) 147 is rendered conductive, the transistor (Q6) 161 is rendered conductive to begin to actuate the energy operated indicator (K1) 163. If suitable current is applied for a suitable interval of time, the indicator (K1) 163 will be actuated to indicate suitable power to fire pyrotechnic cartridges to be subsequently in the cartridge well or breech cap.

Operationally, the circuit is designed such that it takes 10 milliseconds for the transistor (Q2) 95 to turn on after the contacts 35, 57 are energized by the firing system of aircraft. When the transistor (Q2) 95 turns on, the voltage at terminal 97 is dropped to ground and the transistor (Q3) 111 is turned off. The transistor (Q4) 119 and (Q7) 123 are similarly turned off, as is the transistor (Q5) 143. In the event there is not sufficient power for suitable period of time to energize the 3 ampere indicator (K1) 163, but there is a minimum of 1 ampere of current, the indicator (K2) 129 will be actuated. The transistor (Q1) 79 remains conductive and the transistor (Q2) 95 latches on so long as the input terminals are connected with the leading terminals inside a cartridge well or breech cap. The indicators (K1) 163 and (K2) 129 are retained in their respective positions until reset. No changes are experienced in the circuit thereafter until the input terminals 35, 37 are disconnected from the power source.

The indicators (K1) 163 and (K2) 129 are preferably of the magnetic latching type such as those sold under the trademark "Minelco," a subsidiary of General Time of Holbrook, Massachusetts, as shown in their Bulletin B-11Aa entitled "Miniature Bite Indicator," Model BHG21T, having a rating of 3 volts and 13.8 ohms. However, any indicator means is within the broad scope of the invention, including indicator using liquid crystal technology as explained in the July 6, 1970 issue of *Electronics*, the McGraw Hill Publication, page 64.

While the invention has been shown in only one of its forms, it should be apparent to those skilled in the art that it is not so limited but is susceptible to various changes and modifications without departing from the spirit thereof. For example the invention in its broadest aspects is not limited to the specific structures shown and the various element values are given only by way of sample.

We claim:
1. A current potential indicator especially suitable for weapons test systems, said indicator comprising:
a test probe housing;

a pair of electrical contacts carried by one end region of the housing;

an electrical minimum event indicator carried by said housing;

an electrical threshold indicator carried by said housing;

circuit means connected between said contacts and said minimum event indicator for actuation thereof upon sensing a selected minimum quantity of electrical energy;

said circuit means also connected between said contacts and said threshold indicator for actuation thereof when sensing a selected quantity of electrical energy above said minimum; and load disconnect means included in said circuit means and responsive to electrical energy applied to said contacts as a function of time for disconnecting the circuit means after a selected time interval of electrical energy application.

2. The current potential indicator of claim 1 which further comprises:

a constant current source means connected with said contacts, said threshold indicator, and said minimum event indicator for supplying constant current in the circuit.

3. The current potential indicator of claim 2 in which said constant current source means comprises:

a constant current transistor having its emitter and collector connected across said contacts;

a resistor connected between said emitter and one of said contacts;

resistor means connected across said contacts and with the base of said transistor.

4. The current potential indicator of claim 3 in which said circuit means connected between said contacts and said minimum event indicator comprises:

a minimum event transistor having its emitter connected with one of said contacts, its collector connected with said minimum event indicator, which is connected with the other of said contacts, and the base of the transistor connected with resistance means connected between the first of said contacts and the collector of said constant current transistor.

5. The current potential indicator of claim 1 in said circuit means connected between said contacts and said threshold indicator comprises:

a threshold transistor having its emitter connected with one of said contacts, its collector connected with said threshold indicator, which is connected with the other of said contacts, and the base of the transistor connected with resistance means connected between the first of said contacts and the collector of said constant current transistor.

6. The current potential indicator of claim 5 in which the resistance means connected with the base of said threshold transistor is variable for selectivity of the quantity of energy that actuates said threshold indicator.

7. A current potential indicator especially suitable for weapons test systems, said indicator comprising:

a test probe housing;

a pair of electrical contacts carried by one end region of the housing;

latch elements carried by said housing to secure the housing inside a selected test well;

means connected with said latch element for selective actuation thereof;

an electrical bi-stable type minimum event indicator carried by said housing;

an electrical bi-stable type threshold indicator carried by said housing;

circuit means connected between said contacts and said minimum event indicator for providing a flow path of electrical energy from said contacts to said minimum event indicator when the electrical energy is at a predetermined minimum level to allow said minimum event indicator to be actuated solely from the electrical energy derived from the system to be tested;

said circuit means also being connected between said contacts and said threshold indicator for providing a flow path of electrical energy from said contacts to said threshold indicator when the electrical energy is at a predetermined upper threshold level to allow said threshold indicator to be actuated solely from the electrical energy derived from the system to be tested.

8. An electrical potential indicator especially suitable for weapons test systems comprising:

a test probe housing;

input means carried by said housing and adapted to be coupled electrically to a system to be tested;

an indicator carried by said housing;

circuit means connected between said input means and said indicator for actuation thereof upon sensing a given quantity of electrical energy;

said circuit means includes control means for disconnecting said circuit means when actuated;

capacitor means and resistor means for applying an electrical input to said control means;

said capacitor means being adapted to begin charging after electrical energy is applied to said input means to actuate said control means to electrically disconnect said circuit means at a time following the application of the electrical energy to said input means depending upon the R-C time constant of said capacitor means and said resistor means; and constant current means connected between said input means and said capacitor means and resistor means.

* * * * *